March 5, 1968 R. W. STOCKDALE 3,372,309

MULTILAYER ELECTRONIC MODULE

Filed Dec. 23, 1965 2 Sheets-Sheet 1

INVENTOR.
Ralph W. Stockdale
BY
Warren D. Hill
ATTORNEY

MULTILAYER ELECTRONIC MODULE

Filed Dec. 23, 1965

2 Sheets-Sheet 2

INVENTOR.
Ralph W. Stockdale
BY
Walter D. Hill
ATTORNEY 3,372,309
MULTILAYER ELECTRONIC MODULE Ralph W. Stockdale, Greendale, Wis., assignor to General Motors Corporation, Detroit, Mich., a corporation of Delaware Filed Dec. 23, 1965, Ser. No. 516,012
2 Claims. (Cl. 317—101)

ABSTRACT OF THE DISCLOSURE

A printed circuit module contains a plurality of stacked interconnected substrates, each substrate bearing a plurality of identical components arranged in a preordered pattern. Some substrates will have only patterns of conductors thereon. Circuit interconnections are achieved by forming conductors in holes drilled through a stack of substrates and selectively making contact with certain components and conductors.

This invention relates to an electronic module and a process for making the same and more particularly to multilayer electronic modules and a process for making the same.

In the past electronic circuit modules have been fabricated by a great variety of methods requiring specifically designed printed circuit boards with various types of components secured thereto in various locations depending upon the requirements of the specific circuit. Thus, the immense variety of circuits required in the electrical industry required an endless variety of circuit boards and components to be kept on hand and required new boards to be designed and fabricated for each new circuit. Each new circuit design also required the valuable time of highly skilled personnel. In addition, aerospace requirements continually demand more compact and more lightweight electronic assemblies than those presently available.

The present invention provides an electronic module structure and process for making the same, which is not only nearly universal in application, but is also very compact and lightweight. Modules built according to this invention are made up of a few standard parts, regardless of the circuit requirements, and avoid the stock piling of numerous components of various designs. In addition, the invention permits the specific structure of any particular circuit to be designed by computer, thereby economizing in the use of the time of skilled personnel.

The invention is carried out by the process of providing a variety of substrates, each containing an array of components of the same type and value, stacking the substrates, and making electrical connections at those points on the substrates required to form the desired circuit. The invention is also carried out by providing a plurality of superposed substrates, each having formed thereon an array of electrical components, and means for interconnecting the components to complete an electrical circuit.

Figure 1:
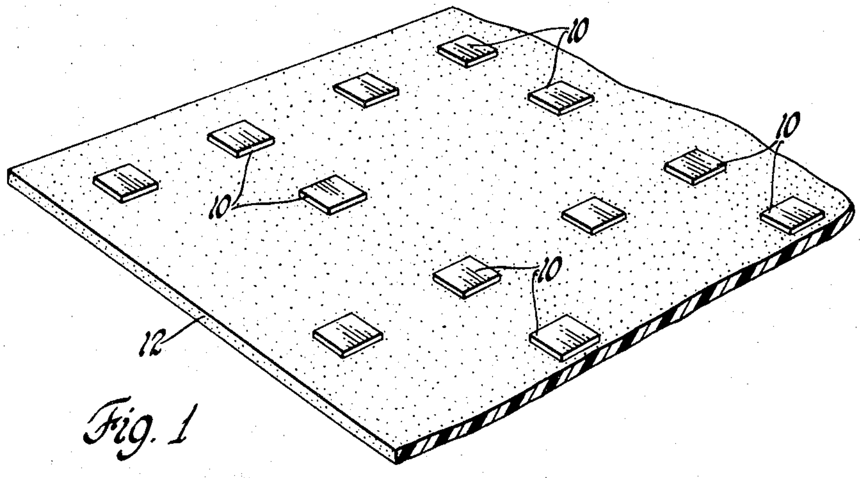
Figures 2, 3:
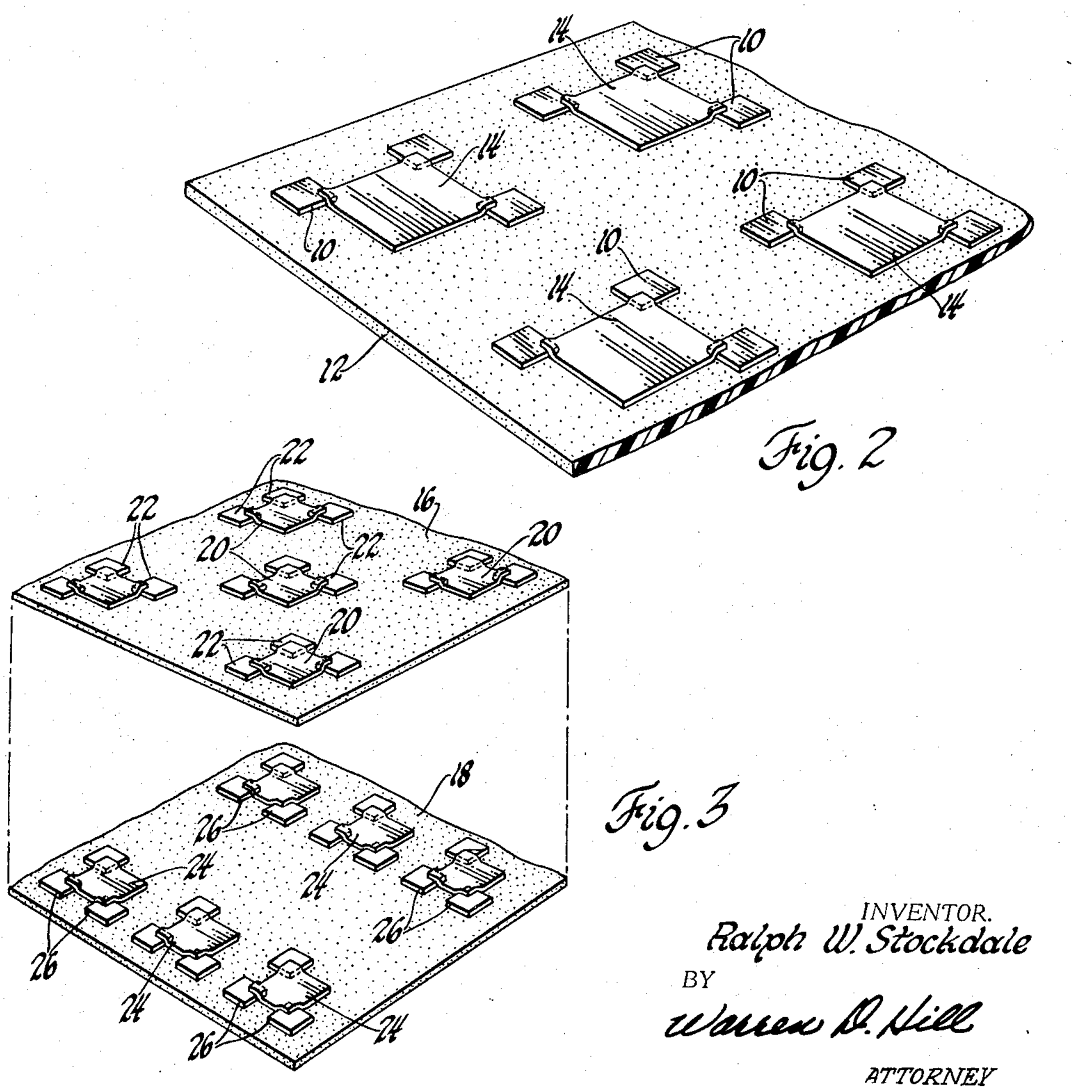
Figure 4:
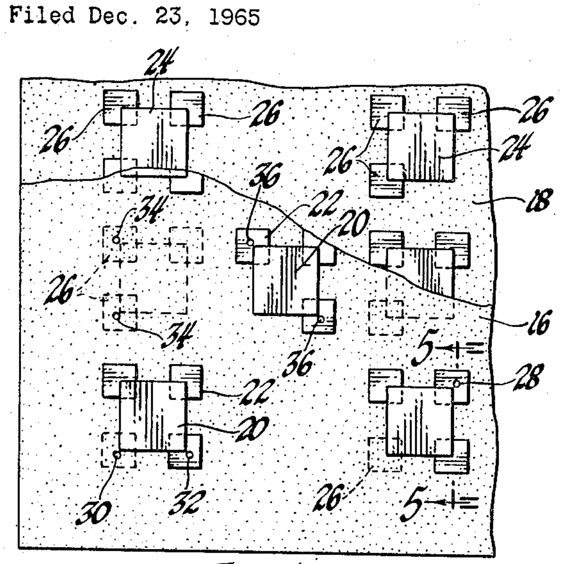
Figure 5:
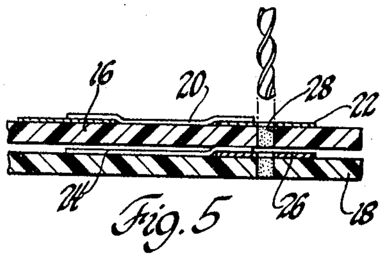
Figure 6:
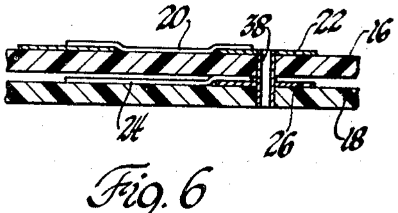
Figure 7:
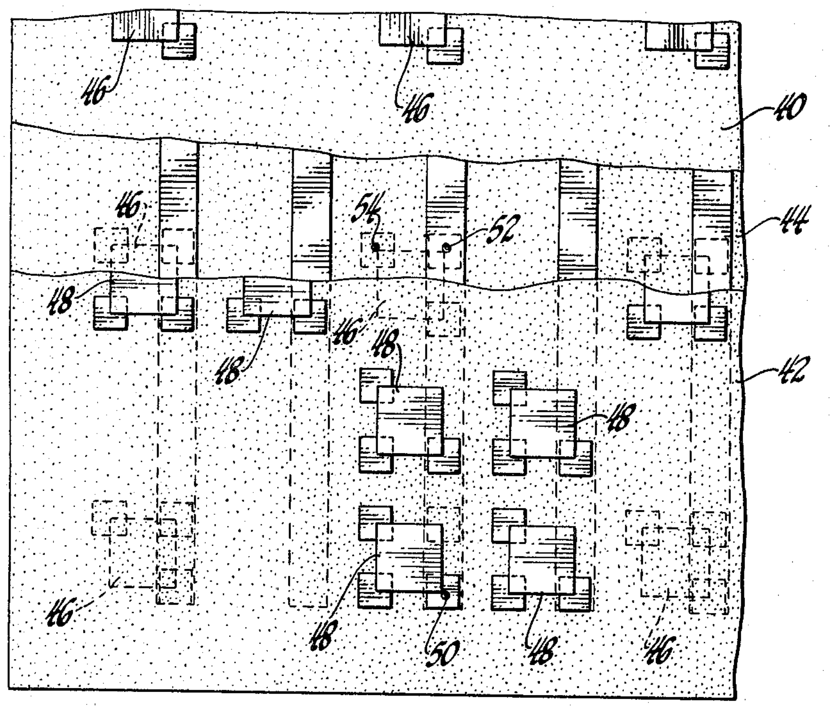

The above and other advantages will be made more apparent from the following description taken in conjunction with the drawings in which:

FIGURES 1 and 2 illustrate steps in the fabrication of a substrate according to the invention, FIGURE 3 is an exploded view showing the means of superposing different substrates according to the invention, FIGURE 4 is a partly broken away plan view of the assembly of FIGURE 3, FIGURES 5 and 6 are cross sectional views taken along line 5—5 of FIGURE 4 which illustrate the method of making electrical interconections between the substrates of FIGURE 4, and FIGURE 7 is a partly broken away plan view of an assembly of substrates, also according to the invention.

It is contemplated by this invention that several types of substrates be provided, each substrate carrying a large number of identical components arranged thereon in specific locations according to a predetermined geometric pattern. For convenience the component values to be used on the several substrates are multiples of ten. That is, one substrate would carry 1 ohm resistors, another would carry 10 ohm resistors, another would carry 100 ohm resistors, etc. Any desired resistance value in a circuit can be achieved by connecting these standard resistors in series and parallel combinations. The pattern of components on a substrate is preferably laid out according to a grid of, say, 10 rows and 10 columns, thus providing 100 possible locations of components on each substrate. The components are arranged in different patterns according to the type and value of component; for example, in the grid of 100 possible locations alternate rows may be omitted; alternate columns may be omitted, or both. There are, of course, an almost unlimited number of geometric patterns of components which might be devised. Each component has connected therewith three connector pads arranged at three corners of an imaginary square around the components. The fourth corner is reserved as a bypass position as will be seen below. The three corners of the square are connection points which will align with other connection points on other substrates as will be seen below. Hence, the connection points must be located in precise locations on the substrate. There is also provided substrates carrying only an array of linear conductors which extend longitudinally, transversely, or diagonally along the substrate to pass through a given set of connection points so that when several component-bearing substrates and one or more conductor-bearing substrates are superposed, some of the connection points on the connector pads are in alignment with each other, or with a conductor, or with both. Then electrical connections can be made in an almost infinite variety of ways by making connections through the stack of substrates to selectively connect certain contact pads with conductors or other contact pads to thereby complete an electrical circuit.

In the process of forming component-bearing substrates copper connector pads 10 are first formed as by vapor deposition on an insulating substrate 12 as shown in FIGURE 1. This figure illustrates only a corner portion of a substrate which will have in that corner four closely grouped components. Accordingly, there are provided twelve contact pads, three for each component located at three of the four corners of a square surrounding the component 14 as shown in FIGURE 2. Each pad need not be centered at a connection point, but must at least cover a connection point. Next, the components 14 themselves are vapor deposited onto the substrate, each in contact with its corresponding contact pad 10. The method of vapor depositing materials onto a substrate in a desired configuration is well known in the art and need not be set forth here. The material to be deposited depends on the type of component desired. Some common examples of components which may be so deposited are gold-platinum or nickel-chromium resistors, silicone monoxide or aluminum oxide capacitors, ferrite induction coils and gold-bonded semiconductor diodes. It is not expected that the contact pads or the components will necessarily be square in configuration as shown in the drawings. To that extent the drawings are symbolic in showing the location of the components, rather than the shape thereof. The components, of course, may be any required configuration, whether square, annular, spiral, zigzag or otherwise, and each contact pad will be of the shape required to extend from its connection point to the portion of the component to be contacted. Also in the drawings the thickness of the deposited films is greatly exaggerated as in most cases the components will be comprised of a very thin film. The essential feature is that the connection points of the contact pads must be located very precisely so as to align with other connection points on other substrates which are to be stacked thereon.

FIGURES 3 and 4 illustrate the step of superposing one substrate 16 on another substrate 18. Substrate 16 carries components 20 having contact pads 22. The components 20 are arranged in a pattern which omits components from alternate possible locations. Substrate 18 carries components 24 having the contact pads 26 wherein alternate columns of components are omitted. When the substrates 16 and 18 are placed in juxtaposition, some of the contact pads 22 overlie the contact pads 26 so that a hole drilled through the connection point of one pad 22 would pass through the connection point of another pad 26 as indicated at 28. On the other hand, due to an asymmetrical arrangement of contact pads, holes may be drilled through both substrates which pass through only one pad as indicated at 30 and 32. In addition, due to the components on each substrate being arranged in different geometric patterns, holes may be drilled through both substrates to intercept only one contact pad as indicated at 34 and 36.

FIGURE 5 taken along lines 5—5 of FIGURE 4 illustrates the means in which the hole 28 is drilled through substrates 16 and 18 to pass through the connection points of contact pads 22 and 26 of components 20 and 24 respectively. Contact pads 22 and 26 are electrically connected through the hole 28 by a conductor 38 deposited within the hole 28 by plating as illustrated in FIGURE 6. Thus, it is readily seen that several substrates containing components or simple conductors may be superposed and the contact pads may be selectively connected with one another or with certain conductors to complete a circuit having components of any value interconnected in any desired manner. This is better illustrated in FIGURE 7 where for clarity, only two component-bearing substrates 40 and 42 and one conductor-bearing substrate 44 are illustrated although the invention contemplates that if desired a large number of substrates may be superposed, including substrates with conductors running in various directions and substrates each having different types of components of different values. For example, substrate 40 carries components 46 in a geometric pattern arrived at by omitting alternate rows and column from the grid of possible component locations. These components 46 may represent, for example, 10 ohm resistors. Substrate 42 carries components 48 arranged in groups of four. These components may represent, for example, 100 ohm resistors or instead they could be 1,000 ohm resistors, the possible value of components being multiples of 10. Other substrates may carry capacitors of various values or similarly induction coils or semiconductor diodes. In any event each type and value of components are arranged in geometric patterns different from that of any other. There is however, due to the great flexibility of the system resulting from this invention, an alternative arrangement. Since the contact pads for each component are asymmetrically arranged, due to the vacant corner for bypass connections, each substrate will represent various geometric patterns according to its angular position. Thus, if a given substrate be rotated in 90° increments a total of four different patterns is achieved. This feature may be used simply to increase the number of possible ways to achieve interconnections from one substrate to another or the additional patterns resulting therefrom may be reserved for components of different classes or values so as to reduce the number of basic pattern designs needed for a complete stock of components.

In the example of FIGURE 7 interconnections may be made by plated-through holes, such as at 50, wherein a contact pad on substrate 40, a pad on substrate 42, and a conductor on substrate 44 are interconnected. Plated-through hole 52 interconnects a conductor on substrate 44 with a pad on substrate 40 where as plated-through hole 54 makes a connection only with a pad on substrate 40. The addition of other substrates not shown in the interest of clarity will make possible an even greater variety of possible connections so that a complete circuit may be realized.

To fabricate any type of circuit, it is necessary merely to have one set of circuit boards of universal application. Each substrate would be identified according to the type and value of component thereon and the geometric arrangement of the components. The position of any component is identified by its row and column on a substrate. Each of these positions is further classified into four divisions corresponding to the location of connector pads of each component. Since connector pads are on three corners of each component the fourth corner is used as a bypass. All this information as to the value of components, the location of components and substrates, and the location of the connector pads and bypass is stored in the memory of a computer. Requirements for a circuit to be designed can be fed to the computer. The computer will: (1) select substrate patterns to be used, (2) give the correct sequence for interconnecting the substrates with a minimum of connections, and (3) give a listing of the correct pads at each component location to be drilled. Using such a system, punch cards can be provided for automatic drilling machines. The substrates are assembled and drilled according to the instructions from a computer, and circuit interconnections are made by plating through the holes.

A major advantage of the process and the article according to this invention is that component parts can be mass produced and stored until needed for use. Design and manufacture time could be minimized by using stock parts and by using computerized designing. Because a very great number of components can be made from the patterns of the stock parts, combinations of several circuits in one small package is possible and in most cases circuit redundancy is possible. This would make practicable the automatic bypassing of a circuit failure in a piece of airborne equipment.

It is not contemplated that the substrate patterns need be limited to the passive circuit elements referred to above. A substrate may include an array of thin film circuits including transistors and the like. Thus, a substrate may contain several integrated circuits consisting of amplifiers or flip flop circuits, for example. The term "component" as used in the claims herein is intended to include such thin film circuits and transistors and the like.

It is to be understood that many variations of the invention are possible. It is not contemplated that the invention be limited to the specific embodiment described herein, rather the scope of the invention is determined by the following claims.

I claim:

1. An electrical circuit module comprising a plurality of stacked substrates, a first substrate having only a geometrical array of electrically isolated components of like type and value, a second substrate having only a geometrical array of electrically isolated components of the type on the first substrate and of a different value, a third substrate having only a geometrical array of electrically isolated components of like type and value and of a type different from that of the first substrate, a fourth substrate having thereon only a plurality of conductors, said substrates being stacked together forming the circuit module, and conductor means extending through the several substrates interconnecting selected ones of the components and said conductors forming an electrical circuit.

2. An electrical circuit module comprising a plurality of stacked substrates, a first substrate having only a geometrical array of spaced electrically isolated components of like type and value, a second substrate having only a geometrical array of spaced electrically isolated components of the type on the first substrate and of a different value, a third substrate having only a geometrical array of spaced electrically isolated components of like type and value and of a type different from that of the first substrate, a fourth substrate having thereon only a plurality of conductors, said substrates being stacked together forming the circuit module, and conductor means extending through the several substrates interconnecting selected ones of the components and said conductors forming an electrical circuit, the components each having three contact pads arranged one at each of three corners of an imaginary square around the components, the fourth corner being vacant to serve as a conductor bypass position, whereby selective interconnection of components is facilitated.

References Cited

UNITED STATES PATENTS 3,274,327 9/1966 Schnitzler ---------- 174—68.6

DARRELL L. CLAY, *Primary Examiner.*